(12) United States Patent
Vong et al.

(10) Patent No.: US 6,734,625 B2
(45) Date of Patent: May 11, 2004

(54) ORGANIC LIGHT EMITTING DEVICE (OLED) WITH MULTIPLE CAPPING LAYERS PASSIVATION REGION ON AN ELECTRODE

(75) Inventors: Cuong Vong, Hamilton (CA); Hany Aziz, Burlington (CA); Zoran D. Popovic, Mississauga (CA); Nan-Xing Hu, Oakville (CA); Ah-Mee Hor, Mississauga (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/209,475

(22) Filed: Jul. 30, 2002

(65) Prior Publication Data
US 2004/0021415 A1 Feb. 5, 2004

(51) Int. Cl.⁷ ................................................ H05B 33/00
(52) U.S. Cl. .................... 313/509; 313/504; 428/917
(58) Field of Search ................ 313/503, 504, 313/506, 509, 511, 512; 428/690, 917; 315/169.3; 345/45, 76; 427/66, 68; 438/106; 257/40, 98, 99, 100

(56) References Cited

U.S. PATENT DOCUMENTS

| 4,356,429 A | 10/1982 | Tang | 313/503 |
|---|---|---|---|
| 4,720,432 A | 1/1988 | VanSlyke et al. | 428/457 |
| 4,769,292 A | 9/1988 | Tang et al. | 428/690 |
| 5,059,861 A | 10/1991 | Littman et al. | 313/503 |
| 5,539,507 A | 7/1996 | Miyashiro et al. | 355/271 |
| 5,811,177 A | 9/1998 | Shi et al. | 428/209 |
| 5,853,905 A | 12/1998 | So et al. | 428/690 |
| 5,925,980 A | 7/1999 | So et al. | 313/504 |
| 5,990,615 A | 11/1999 | Sakaguchi et al. | 313/504 |
| 6,114,055 A | 9/2000 | Choong et al. | 428/690 |
| 6,130,001 A | 10/2000 | Shi et al. | 428/690 |
| 6,140,766 A * | 10/2000 | Okada et al. | 313/506 |
| 6,198,220 B1 * | 3/2001 | Jones et al. | 313/512 |
| 6,339,289 B1 | 1/2002 | Fork | 313/506 |
| 6,392,250 B1 | 5/2002 | Aziz et al. | 257/40 |

FOREIGN PATENT DOCUMENTS

GB       WO 00/36661       * 6/2000

* cited by examiner

Primary Examiner—Ashok Patel
(74) Attorney, Agent, or Firm—Fay, Sharpe, Fagan, Minnich & McKee, LLP

(57) ABSTRACT

An organic fight emitting device (OLED) will have multiple capping layers on an electrode to provide a passivation region to prevent formation of dark spots. The passivation capping layers are, in sequence from the electrode, a first dielectric material layer, a metal or metal alloy layer with a work function of less than 4 eV, and a second dielectric protective layer.

21 Claims, 2 Drawing Sheets

ORGANIC LIGHT EMITTING DEVICE (OLED) WITH MULTIPLE CAPPING LAYERS PASSIVATION REGION ON AN ELECTRODE

BACKGROUND OF THE INVENTION

The present invention relates generally to an organic light emitting device (OLED), and more particularly to multiple capping layers on an electrode to provide a passivation region for the OLED to prevent formation of dark spots.

Organic light emitting devices (OLEDs) represent a promising technology for display applications. A typical organic light emitting device includes a transparent or a substantially transparent substrate; a transparent or substantially transparent first electrode, which usually acts as a hole-injecting anode; a luminescent region comprising an organic electroluminescent material; and a second electrode, which usually acts as an electron injecting cathode.

When a voltage is applied across the first and second electrodes, electrons are injected from the cathode into the luminescent region and holes are injected from the anode into the luminescent region. The holes and electrons recombine in the luminescent region, which emits light through the anode and through the substrate.

To achieve efficient electroluminescence, some known organic light emitting devices include in the luminescent region, multiple layers, such as, a layer comprising a hole transport material (HTM) adjacent to the anode, a layer comprising an emitter material (EM) which can also have charge transport properties, and/or a layer comprising an electron transport material (ETM) Examples of these organic light emitting devices can, for instance, be found in U.S. Pat. Nos. 4,356,429, 5,539,507, 4,720,432 and 4,769,292, the embodiments of which are included herein by reference in their entirety. During operation, an applied electric field causes positive charges (holes) and negative charges (electrons) to be respectively injected from the anode and the cathode in the luminescent region to recombine in the EM layer and thereby produce light emission.

Electroluminescence can be obtained from organic light emitting devices containing mixed layers in the luminescent region, for example, layers in which both a hole transport material and an electron transport material are mixed together in one single layer. Examples of these organic light emitting devices can be found, for instance, in U.S. Pat. Nos. 5,853,905, 5,925,980, 6,114,055, 6,130,001, 6,392,250, and 6,392,339, the embodiments of which are included herein by reference in their entirety.

Dark spot propagation is the propagation of non-emissive, i.e. dark, areas in an organic light emitting device. Dark spot propagation destroys the emission capability of light emitting devices such as light emitting devices used in image displays, light-emitting bars used for printing, and light emitting devices used in various illumination applications.

Although dark spot propagation can affect all types of light emitting devices, polymeric and small-molecule based organic light emitting diodes (OLEDs) suffer an increased susceptibility to dark spot propagation. Metals with low work functions, and hence high reactivity, are usually used in the cathodes of OLEDs. Due to their high reactivity, such cathode materials are unstable in ambient conditions and react with atmospheric $O_2$ and water to form non-emissive dark spots in the OLED. The ambient moisture causes either adhesion failure between the cathode and the luminescent region, or oxidation of the cathode material which results in a lack of current flow at these areas, thus forming the dark spots.

A passivation layer can be formed on the cathode of an OLED to provide a moisture barrier. U.S. Pat. No. 5,059,861 has a single passivation layer of an alkaline earth metal on the cathode. U.S. Pat. No. 5,990,615 describes an organic light emitting device including an insulative (i.e. dielectric) protective layer on the cathode. U.S. Pat. No. 5,811,177 describes a protective region on the cathode consisting of a first layer composed of indium metal, a second layer composed of an organic material a third layer composed of a thermal coefficient matching material which may comprise a low work function metal which can optionally be a gettering material, a fourth layer composed of a low permeability inorganic material such as a metal and a fifth layer composed of epoxy or aluminum foil. World Patent Application Number WO 00/36661 describes an OLED having a passivation region consisting of one or two dielectric material layer(s) on the cathode, and interposed between the cathode and the one or more dielectric layers is an optional layer composed of a gettering material.

It is an object of the present invention to provide a multiple capping layer for a passivation region for an OLED cathode or anode to prevent formation of dark spots.

SUMMARY OF THE INVENTION

According to the present invention, an organic light emitting device (OLED) will have multiple capping layers on an electrode to provide a passivation region to prevent formation of dark spots. The passivation capping layers are, in sequence from the electrode, a first dielectric material layer, a metal or metal alloy layer with a work function of less than 4 eV, and a second dielectric protective layer.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof. In addition, the figures are not drawn to scale for ease of understanding the present invention.

Figure 1:
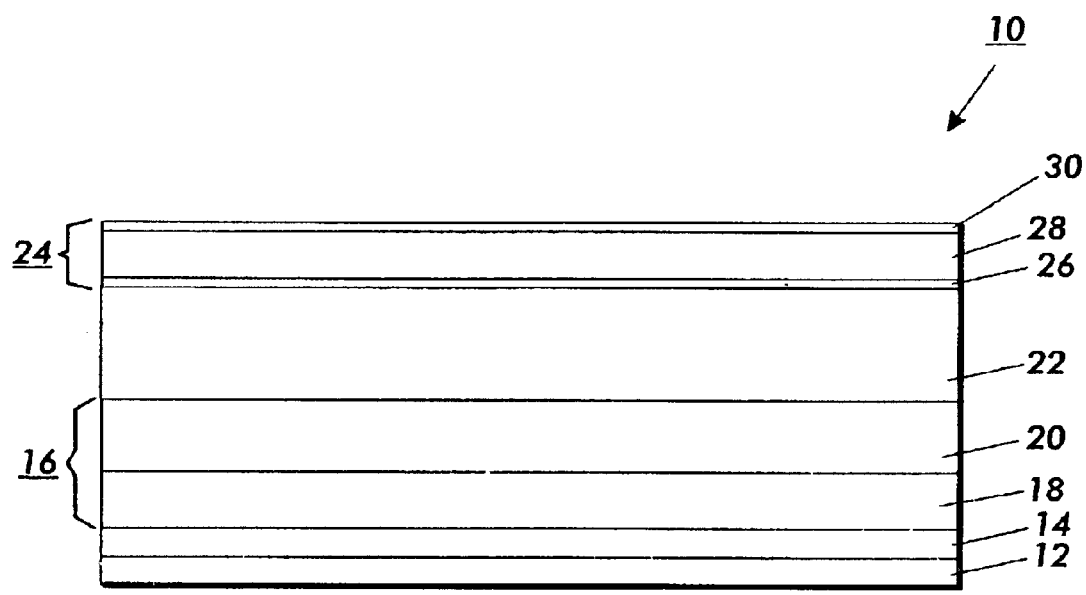
FIG. 1 illustrates an organic light emitting device comprising multiple capping layers on the cathode for passivation to prevent the formation of dark spots in accordance with a first embodiment of the present invention.

Reference is now made to FIG. 1, wherein there is illustrated an organic light emitting device (OLED) 10 with multiple capping layers on the cathode to provide a passivation region to prevent formation of dark spots in accordance with this invention.

The OLED 10 has a transparent or a substantially transparent substrate 12, such as, for example, a glass or a MYLAR® support. A transparent or a substantially transparent indium tin oxide (ITO) anode 14 having a thickness of 30 nm is formed on the substrate 12. A luminescent region 16 of an organic electroluminescent material is formed on the anode 14. The luminescent region 16 has a naphtyl-substituted benzidine derivative, N,N'-di-1-naphthyl-N,N'-diphenyl-1,1'-biphenyl-1,1'-biphenyl-4,4'-diamine (NPB) hole transport layer 18 having a thickness of 60 nm formed on the anode 14 and a tris(8-hydroxyquinolinate) aluminum ($AlQ_3$) emitting electron transport layer 20 having a thickness of 75 nm formed on the hole transport layer 18. A Mg:Ag (90 percent volume Mg and 10 percent volume Ag) cathode 22 having a thickness of 120 nm is formed on the electron transport layer 20 of the luminescent region 16.

The passivation region 24 is formed on the cathode 22. The passivation region functions as a moisture barrier, that prevents, or at least reduces, the permeation of ambient moisture and/or oxygen to the cathode, the luminescent region, and the anode. The passivation region 24 includes a first dielectric material layer 26, such as an inorganic layer comprised of either silicon oxide (SiO), silicon dioxide ($SiO_2$), silicon nitride ($Si_3N_4$), aluminum oxide ($Al_2O_3$), lithium fluoride (LiF), magnesium fluoride ($MgF_2$) or a mixture of two or more thereof. The first dielectric material layer 26 having a thickness of from about 10 nm to about 500 nm is formed on the cathode 22. The passivation region 24 includes a low work function metal or metal alloy layer 28, with a work function less than 4 eV, comprised of Li, Be, Na, Mg, K, Ca, Rb, Sr, Cs, Ba, Ce, La, Nd, Sm, In, LiAl, or Mg:Ag. The metal or metal alloy layer 28 having a thickness of from about 50 nm to about 3000 nm is formed on the first dielectric material layer 26. The passivation region 24 includes a second dielectric material layer 30, such as, for example, an inorganic layer comprised of either silicon oxide (SiO), silicon dioxide ($SiO_2$), silicon nitride ($Si_3N_4$), aluminum oxide ($AM_2O_3$), lithium fluoride (LiF), magnesium fluoride ($MgF_2$) or a mixture of two or more thereof. The second dielectric material layer 30 having a thickness of from about 10 nm to about 500 nm is formed on the low work function metal or metal alloy layer 28. The first dielectric material layer 26, the low work function metal or metal alloy layer 28 and the second dielectric material layer 30 form the multiple capping layers of the passivation region 24 on the cathode 22 to prevent formation of dark spots in the OLED 10.

An external power source (not shown in the Figure) will forward bias the anode 14 in relation to the cathode 22. Holes will be injected from the anode 14 through the hole transport layer 18 of the luminescent region 16 and into the electron transport layer 20 of the luminescent region 16. Concurrently electrons will be injected from the cathode 22 into the electron transport layer 20 of the luminescent region 16. The holes and the electrons will combine and emit light. The light will be emitted from the luminescent region 16 through the transparent anode 14 and the transparent substrate 12. Alternate OLED designs allow the light to be emitted from the edge of the luminescent region 16 or through a transparent cathode 22.

The dielectric material of layers 26 and 30 need not be the same inorganic dielectric material for both layers.

Figure 2:
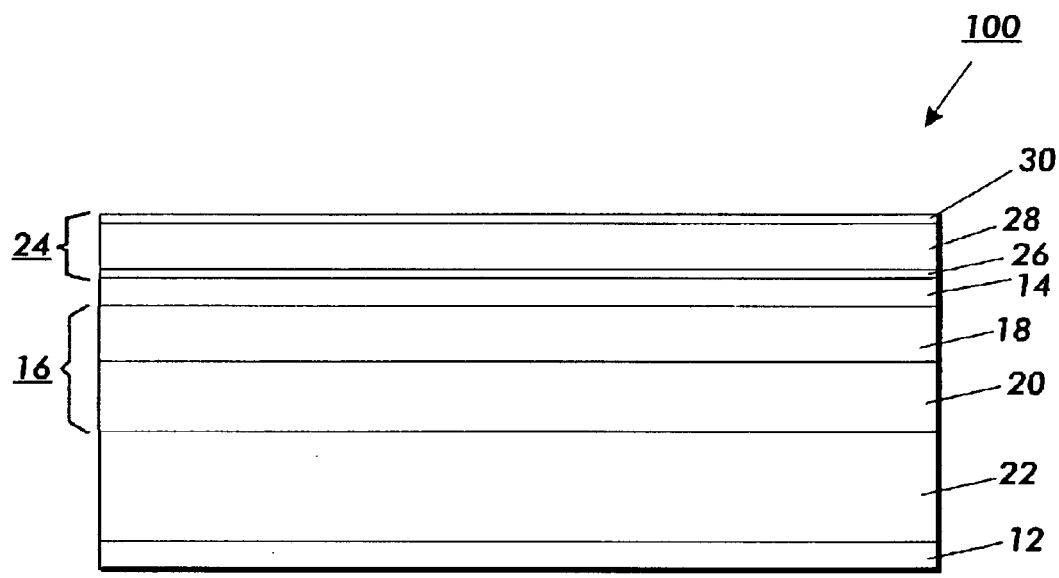
FIG. 2 illustrates an organic light emitting device comprising multiple capping layers on the anode for passivation to prevent the formation of dark spots in accordance with a second embodiment of the present invention.

Reference is now made to FIG. 2, wherein there is illustrated an organic light emitting device (OLED) 100 with multiple capping layers on the anode to provide a passivation region to prevent formation of dark spots in accordance with this invention. The OLED 100 of FIG. 2 is similar to the OLED 10 of FIG. 1 except the anode 14, the luminescent region 16 and the cathode 22 are inverted between the substrate 12 and the passivation region 24.

The OLED 100 has a substrate 12, such as glass or MYLAR®. A cathode 22 formed of a first layer of indium tin oxide having a thickness of about 30 nm coated on the substrate 12, and a second layer of Mg:Ag (90 percent volume Mg and 10 percent volume Ag) having a thickness of 10 nm is formed on the first indium tin oxide layer. A luminescent region 16 of an organic electroluminescent material is formed on the cathode 22. The luminescent region 16 has a tris(8-hydroxyquinolinate) aluminum ($AlQ_3$) emitting electron transport layer 20 having a thickness of 75 nm formed on the cathode 22 and a naphtyl-substituted benzidine derivative, N,N'-di-1-naphthyl-N,N'-diphenyl-1, 1'-biphenyl-1,1'-biphenyl-4,4'-diamine (NPB) hole transport layer 18 having a thickness of 72 nm formed on the electron transport layer 20. An indium tin oxide (ITO) anode 14 having a thickness of 30 nm is formed on the hole transport layer 18 of the luminescent region 16.

The passivation region 24 is formed on the anode 14. The passivation region 24 includes a first dielectric material layer 26, such as an inorganic layer comprised of either silicon oxide (SiO), silicon dioxide ($SiO_2$), silicon nitride ($Si_3N_4$), aluminum oxide ($Al_2O_3$), lithium fluoride (LiF), magnesium fluoride ($MgF_2$) or a mixture of two or more thereof. The first dielectric material layer 26 having a thickness of from about 10 nm to about 500 nm is formed on the anode 14. The passivation region 24 includes a low work function metal or metal alloy layer 28, with a work function less than 4 eV, comprised of Li, Be, Na, Mg, K, Ca, Rb, Sr, Cs, Ba, Ce, La, Nd, Sm, In, LiAl, or Mg:Ag. The metal or metal alloy layer 28 having a thickness of from about 50 nm to about 3000 nm is formed on the first dielectric material layer 26. The passivation region 24 includes a second dielectric material layer 30, such as, for example, an inorganic layer comprised of either silicon oxide (SiO), silicon dioxide ($SiO_2$), silicon nitride ($Si_3N_4$), aluminum oxide ($Al_2O_3$), lithium fluoride (LiF), magnesium fluoride ($MgF_2$) or a mixture of two or more thereof. The second dielectric material layer 30 having a thickness of from about 10 nm to about 500 nm is formed on the low work function metal or metal alloy layer 28. The first dielectric material layer 26, the low work function metal or metal alloy layer 28 and the second dielectric material layer 30 form the multiple capping layers of the passivation region 24 on the anode 14 to prevent formation of dark spots in the OLED 100.

An external power source (not shown in the Figure) will forward bias the anode 14 in relation to the cathode 22 in OLED 100. Holes will be injected from the anode 14 through the hole transport layer 18 of the luminescent region 16 and into the electron transport layer 20 of the luminescent region 16. Concurrently electrons will be injected from the cathode 22 into the electron transport layer 20 of the luminescent region 16. The holes and the electrons will combine and emit light. The light will be emitted from the edge of the luminescent region 16 of OLED 100 or, if the cathode 22 is transparent, then from the luminescent region 16 through the transparent cathode 22 and the transparent substrate 12.

The dielectric material of layers 26 and 30 need not be the same inorganic dielectric material for both layers.

An OLED without the passivation region of the present invention, which is stored in ambient laboratory conditions for 26 days, shows dark spots covering about 95 percent of the surface area on the OLED. Under the same conditions, an OLED which contains a prior-art passivation region, which does not include a first dielectric material layer and therefore is not according to embodiments of the present invention, shows dark spots covering 70 to 80 percent of the surface area on the OLED. Under the same conditions, an OLED with the passivation region of the present invention results in dark spots limited to covering only 10 to 15 percent of the surface area of the OLED. In the passivation region, both the first dielectric material layer between the electrode and the metal or metal alloy layer and the second dielectric material layer reduce the formation of dark spots in the OLED.

The substrate 12 can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Mixtures of these various materials can also be used. Other substrate materials can also be selected provided, for example, that the materials can effectively support the other layers, and do not interfere with the device functional performance. Preferably, in embodiments, the substrate is formed of a light transmission material.

The thickness of the substrate 12 is not particularly limited except by the structural demands of the organic light emitting device and its intended use. Suitable thicknesses include, for example, from about 25 μm to at least about 1,000 μm.

In the organic light emitting device 10, the anode 14 can comprise suitable positive charge injecting electrodes such as indium tin oxide (ITO), tin oxide, gold and platinum. Other suitable materials for forming the anode include, but are not limited to, electrically conductive carbon, π-conjugated polymers such as polyaniline, polythiophene, polypyrrole, and the like having, for example, a work function equal to, or greater than, about 4 eV, and preferably from about 4 eV to about 6 eV.

The anode 14 can have any suitable form. A thin conductive layer can be coated onto a fight transmissive substrate, such as, for example, a transparent or substantially transparent glass plate or plastic film. Embodiments of organic fight emitting devices can comprise a light transmissive anode formed from tin oxide or indium tin oxide coated on glass. Also, very thin light-transparent metallic anodes having a thickness, for example, of less than about 200 Å, and, preferably, from about 75 Å to about 150 Å can be used. These thin anodes can comprise metals such as gold, palladium and the like. In addition, transparent or semi-transparent thin layers of conductive carbon or conjugated polymers such as polyaniline, polythiophene, polypyrrole and the like can be used to form anodes. These thin layers can have a thickness of, for example from 50 Å to about 175 Å.

The thickness of the anode 14 can range from about 1 nm to about 5000 nm. The preferred thickness range of the anode is dependent on the optical constants of the anode material. One preferred thickness range of the anode is from about 30 nm to about 300 nm. Although less preferred, thicknesses outside of this range can also be used.

The luminescent region 16 of the light emitting device 10 comprises at least one layer of organic electroluminescent material. Suitable organic electroluminescent materials for a single layer luminescent region 16 include, for example, polyphenylenevinylenes, such as poly(p-phenylenevinylene) PPV, poly(2-methoxy-5-(2-ethylhexyloxy) 1,4-phenylenevinylene) MEHPPV and poly (2,5-dialkoxyphenylenevinylene) PDMeOPV, and other materials disclosed in U.S. Pat. No. 5,247,190, which is incorporated herein by reference in its entirety; polyphenylenes, such as poly(p-phenylene) PPP, ladder-poly-para-phenylene (LPPP), and poly(tetrahydropyrene) PTHP; and polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers.

Another class of organic electroluminescent materials that can be utilized in the single layer luminescent region 16 includes, but is not limited to, the metal oxinoid compounds. Illustrative examples include tris(8-hydroxyquinolinate) aluminum (AlQ$_3$), which is one preferred example, and bis(8-hydroxyquinolato)-(4-phenylphenolato) aluminum (BAlq) which is another preferred example. Other examples of this class of materials include tris(8-hydroxyquinolinale) gallium, bis(8-hydroxyquinobinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds, such as metal thioxinoid compounds of bis(8-quinolinethiolato)zinc, bis(8-quinolinelhiolato)cadmium, tris(8-quinolinethiolato) gallium, tris(8-quinolinethiolato)indium, bis(5-methylquinolinethiolato)zinc, tris(5-methylquinolinethiolato)galium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

Yet another class of organic electroluminescent materials that can be used in the single layer luminescent region 16 comprises stilbene derivatives. A preferred stilbene derivative is 4,4'-bis(2,2-diphenylvinyl)biphenyl.

Another class of suitable organic electroluminescent materials suitable for utilizing in the single layer luminescent region 16 is the oxadiazole metal chelates. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3, 4-oxadiazolato]beryllium; bis(2-hydroxyphenyl)5-phenyl-1, 3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tertbutylphenyl)-2-(2-hydroxyphenyl)-1,3,4-oxadiazolato]beryllium; bis[2-(2-hydroxyphenyl)5-(3-fluorophenyl)-1,3,4-oxadiazolato]zinc; bis[2-(2-hydroxyphenyl)-5-(4-fluorophenyl)-1,3,4-oxadiazolato] zinc; bis[2-(2-hydroxyphenyl)-5-(4-fluorophenyl)-1,3,4- oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato] beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like; and the triazines.

The luminescent region 16 can further include from about 0.01 weight percent to about 25 weight percent of a luminescent material as a dopant. Examples of dopant materials that can be utilized in the luminescent region 16 are fluorescent materials, such as, for example, coumarin, dicyanomethylene pyranes, polyrrethine, oxabenzanthrane, xanthene, pyrylium, carbostyl, perylene, and the like. Another preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like. Another class of fluorescent materials that may be used is fused ring fluorescent dyes. Exemplary suitable fused ring fluorescent dyes include perylene, rubrene, anthracene, coronene, phenanthrecene, pyrene and the like. Also, fluorescent materials include butadienes, such as 1,4-diphenylbutadiene and tetraphenylbutadiene, and stilbenes, and the like.

Additionally, luminescent dopants that can be utilized in the light luminescent region 16 are the fluorescent dyes, such as, for example, 4-(dicyanomethylene)-2-I-propyl-6-(1,1,7,7-tetramethyljulolidyl-9-enyl)-4H-pyran (DCJTB); the lanthanide metal chelate complexes, such as for example, tris(acety lacetonato)(phenanthroline) terbium, tris(acetyl acetonato)(phenanthroline) europium, and tris(thenoyl trisfluoroacetonato) (phenanthroline) europium; and phosphorescent materials, such as, for example, organometallic compounds containing heavy metal atoms that lead to strong spin-orbit coupling. Preferred examples include 2,3,7,8,12,13,17,18-octaethyl-21H23H-phorpine platinum(II) (PtOEP) and fac tris(2-phenylpyridine)iridium (Ir(ppy)$_3$).

The luminescent region 16 can have two layers; a hole transport layer 18 and an electron layer 20.

The luminescent region 16 can also include one or more materials with hole-transporting properties. Examples of hole-transporting materials that can be utilized in the hole transport layer 18 of the luminescent region 16 include polypyrrole, polyanliune, poly(phenylene vinylene), polythiophene, polyarylamine, PEDOT, and their derivatives, and known semiconductive organic materials; porphyrin derivatives such as 1,10,15,20-tetraphenyl-21H, 23H-porphyrin copper (II); copper phthalocyanine, copper tetramethyl phthalocyanine; zinc phthalocyanine; titanium oxide phthalocyanine; magnesium phthalocyanine; and the like.

A specific class of hole transporting materials that can be utilized in the hole transport layer 18 of the luminescent region 16 are the aromatic tertiary amines. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like. Another class of aromatic tertiary amines are polynuclear aromatic amines. Examples of these polynuclear aromatic amines include, but are not limited to, N,N-bis[4'-(N-phenyl-N-m-tolylamino)-4-biphenylyl] aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the hole transport layer 18 of the luminescent region 16 are the indolo-carabazoles, such as, for example, 5,11-di-naphthyl-5,11-dihydroindolo[3,2-b]carbazole, and 2,8-dimethyl-5,11-dinaphthyl-5,11-dihydroindolo[3,2-b] carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N;-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis (3methoxyphenyl)-N,N'-diphenyl-1,1'-biphenyl-4,4'-diamine, and the like. Preferred hole transporting materials that can be used in the hole transport layer 18 of the luminescent region 16 are the naphtyl-substituted benzidine derivatives.

The luminescent region 16 can also include one or more materials with electron transporting properties. An example of electron transporting materials that can be utilized in the electron transport layer 20 of the luminescent region 16 is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers.

Other examples of electron transporting materials that can be utilized in the electron transport layer 20 of the luminescent region 16 can be selected from the metal oxinoid compounds, the oxadiazole metal chelate compounds, the triazine compounds and the stilbene compounds, examples of which have been described above in detail.

In embodiments where the luminescent region 16 includes one or more hole transport material and/or one or more electron transport material in addition to the organic electroluminescent material(s), the organic electroluminescent material, the hole transport material(s), and/or the electron transport material(s) can be formed in separate zones or layers of the luminescent region; and/or in the same zone or layer of the luminescent region thus forming mixed zones or layers of two or more materials.

The thickness of the luminescent region 16 can vary from for example, about 1 nm to about 1000 nm, typically from about 20 nm to about 200 nm, and preferably from about 50 nm to about 150 nm.

The cathode 22 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals.

The Mg-Ag alloy cathodes are preferred cathode materials for forming the cathode 22. Other preferred cathodes are formed from lithium alloys with other high work function metals such as aluminum and indium.

The cathode 22 can also include an electron injection layer in contact with the luminescent zone made of an insulative material such as an oxide material or an alkaline metal compound.

The thickness of the cathode 22 can range from, for example, about 10 nm to about 500 nm. Of course, thicknesses outside of this range can also be used.

Electroluminescent devices including passivation regions according to this invention can be used in various types of image forming devices or display applications, such as, for example, flat panel displays. Such applications can be used in a wide range of products, such as, for example, displays for televisions and computers, instrument displays, displays for automotive and aviation applications, and hand-held electronic devices, such as, for example, cellular phones, etc.

While the invention has been described in conjunction with the specific embodiments described above, it is evident that many alternatives, modifications and variations are apparent to those skilled in the art. Accordingly, embodiments of the invention as set forth above are intended to be illustrative and not limiting. Various changes can be made without departing from the spirit and scope of the invention.

What is claimed is:

1. An organic light emitting device comprising:
    a substrate;
    an anode on said substrate;
    a luminescent region on said anode comprising an organic electroluminescent material;
    a cathode on the said luminescent region, such that biasing said cathode and said anode causes light emission from said luminescent region; and
    capping layers for passivation of said organic light emitting device including:
        a first dielectric material layer on said cathode;
        a reactive metal layer on said first dielectric material layer comprising a reactive metal or metal alloy with a work function less than 4 eV; and
        a second dielectric material layer on said reactive metal layer;
        and wherein said organic light emitting device has dark spots covering less than about 15% of a surface area of the device.

2. The organic light emitting device of claim 1 wherein the dielectric material of said first dielectric material layer and said second dielectric material layer includes SiO, $SiO_2$, $Si_3N_4$, $Al_2O_3$, LiF, or $MgF_2$ or mixtures thereof.

3. The organic light emitting device of claim 1 wherein the metal or metal alloy of said metal layer includes Li, Be, Na, Mg, K, Ca, Rb, Sr, Cs, Ba, Ce, La, Nd, Sm, In, LiAl, or Mg:Ag or mixtures thereof.

4. The organic light emitting device of claim 2 wherein the reactive metal of said reactive metal layer includes Li, Be, Na, Mg, K, Ca, Rb, Sr, Cs, Ba, Ce, La, Nd, Sm, In, LiAl, or Mg:Ag or mixtures thereof.

5. The organic light emitting device of claim 1 wherein said luminescent region comprises:
    a hole transport layer, adjacent to said anode, comprised of hole transport material; and
    an electron transport layer, adjacent to said cathode, comprised of electron transport material;
    wherein at least one of said hole transport layer and said electron transport layer emits light.

6. The organic light emitting device of claim 1 wherein said luminescent region comprises:
    a hole transport layer, adjacent to said anode, comprised of hole transport material;
    an electron transport layer, adjacent to said cathode, comprised of electron transport material; and
    a light emitting layer, interposed between said hole transport layer and said electron transport layer, comprised of said organic electroluminescent material.

7. The organic light emitting device of claim 1 wherein said luminescent region comprises a mixed region including a mixture of a hole transport material and an electron transport material.

8. A display device comprising
    a substrate;
    an anode on said substrate;
    a luminescent region on said anode comprising an organic electroluminescent material;
    a cathode on the said luminescent region, such that biasing said cathode and said anode causes light emission from said luminescent region; and
    capping layers for passivation of said organic light emitting device including:
        a first dielectric material layer on said cathode;
        a reactive metal layer on said first dielectric material layer comprising a reactive metal or metal alloy with a work function less than 4 eV; and
        a second dielectric material layer on said reactive metal layer;
        and wherein said organic light emitting device has dark spots covering less than about 15% of a surface area of the device.

9. The display device of claim 8 wherein the dielectric material of said first dielectric material layer and said second dielectric material layer includes SiO, $SiO_2$, $Si_3N_4$, $Al_2O_3$, LiF, or $MgF_2$ or mixtures thereof.

10. The display device of claim 8 wherein the metal or metal alloy of said metal layer includes Li, Be, Na, Mg, K, Ca, Rb, Sr, Cs, Ba, Ce, La, Nd, Sm, In, LiAl, or Mg:Ag or mixtures thereof.

11. The display device of claim 9 wherein the reactive metal of said reactive metal layer includes Li, Be, Na, Mg, K, Ca, Rb, Sr, Cs, Ba, Ce, La, Nd, Sm, In, LiAl, or Mg:Ag or mixtures thereof.

12. The display device of claim 8 wherein said luminescent region comprises:

a hole transport layer, adjacent to said anode, comprised of hole transport material; and an electron transport layer, adjacent to said cathode, comprised of electron transport material;

wherein at least one of said hole transport layer and said electron transport layer emits light.

13. The display device of claim 8 wherein said luminescent region comprises:

a hole transport layer, adjacent to said anode, comprised of hole transport material;

an electron transport layer, adjacent to said cathode, comprised of electron transport material; and a light emitting layer, interposed between said hole transport layer and said electron transport layer, comprised of said organic electroluminescent material.

14. The display device of claim 8 wherein said luminescent region comprises a mixed region including a mixture of a hole transport material and an electron transport material.

15. An organic light emitting device comprising:

a substrate;

a cathode on said substrate;

a luminescent region on said cathode comprising an organic electroluminescent material;

an anode on the said luminescent region, such that biasing said cathode and said anode causes light emission from said luminescent region; and capping layers for passivation of said organic light emitting device including:
 a first dielectric material layer on said anode;
 a reactive metal layer on said first dielectric material layer comprising a reactive metal or metal alloy with a work function less than 4 eV; and
 a second dielectric material layer on said reactive metal layer;

and wherein said organic light emitting device has dark spots covering less than about 15% of a surface area of the device.

16. The organic light emitting device of claim 15 wherein the dielectric material of said first dielectric material layer and said second dielectric material layer includes SiO, $SiO_2$, $Si_3N_4$, $Al_2O_3$, LiF, or $MgF_2$ or mixtures thereof.

17. The organic light emitting device of claim 15 wherein the metal or metal alloy of said metal layer includes Li, Be, Na, Mg, K, Ca, Rb, Sr, Cs, Ba, Ce, La, Nd, Sm, In, LiAl, or Mg:Ag or mixtures thereof.

18. The organic light emitting device of claim 16 wherein the reactive metal of said reactive metal layer includes Li, Be, Na, Mg, K, Ca, Rb, Sr, Cs, Ba, Ce, La, Nd, Sm, In, LiAl, or Mg:Ag or mixtures thereof.

19. The organic light emitting device of claim 15 wherein said luminescent region comprises:

an electron transport layer, adjacent to said cathode, comprised of electron transport material;

a hole transport layer, adjacent to said anode, comprised of hole transport material; and wherein at least one of said hole transport layer and said electron transport layer emits light.

20. The organic light emitting device of claim 15 wherein said luminescent region comprises:

an electron transport layer, adjacent to said cathode, comprised of electron transport material;

a hole transport layer, adjacent to said anode, comprised of hole transport material; and a light emitting layer, interposed between said hole transport layer and said electron transport layer, comprised of said organic electroluminescent material.

21. The organic light emitting device of claim 15 wherein said luminescent region comprises a mixed region including a mixture of a hole transport material and an electron transport material.

* * * * *